US010229751B2

(12) United States Patent
Avraham et al.

(10) Patent No.: US 10,229,751 B2
(45) Date of Patent: Mar. 12, 2019

(54) STORAGE SYSTEM AND METHOD FOR BAD BLOCK RECYCLING

(71) Applicant: Western Digital Technologies, Inc., Irvine, CA (US)

(72) Inventors: Dudy Avraham, Even Yehuda (IL); Ran Zamir, Ramat Gan (IL); Idan Alrod, Herzliya (IL); Eran Sharon, Rishon Lezion (IL)

(73) Assignee: Western Digital Technologies, Inc., Irvine, CA (US)

(*) Notice: Subject to any disclaimer, the term of this patent is extended or adjusted under 35 U.S.C. 154(b) by 0 days.

(21) Appl. No.: 15/583,747

(22) Filed: May 1, 2017

(65) Prior Publication Data
US 2018/0315487 A1 Nov. 1, 2018

(51) Int. Cl.
G11C 29/00 (2006.01)
G11C 29/12 (2006.01)
G11C 16/14 (2006.01)

(52) U.S. Cl.
CPC ............ G11C 29/765 (2013.01); G11C 16/14 (2013.01); G11C 29/12 (2013.01); G11C 2029/1202 (2013.01)

(58) Field of Classification Search
CPC ....... G11C 29/765; G11C 29/12; G11C 16/14; G11C 2029/1202
USPC .............................. 365/200, 185.09, 201, 51
See application file for complete search history.

(56) References Cited

U.S. PATENT DOCUMENTS

| 7,970,985 | B2 | 6/2011 | Gonzalez et al. |
| 8,117,381 | B2 | 2/2012 | Gonzalez et al. |
| 8,812,934 | B2* | 8/2014 | Guyot ................ G06F 11/08 714/764 |
| 8,902,686 | B2* | 12/2014 | Jeong ................ G11C 29/04 365/200 |
| 2005/0144516 | A1 | 6/2005 | Gonzalez et al. |
| 2007/0285981 | A1* | 12/2007 | Roohparvar ......... G11C 29/808 365/185.09 |
| 2012/0226963 | A1* | 9/2012 | Bivens ............... G11C 29/42 714/773 |
| 2015/0003156 | A1* | 1/2015 | Berckmann ........... G11C 29/88 365/185.09 |
| 2015/0162093 | A1* | 6/2015 | Oh ..................... G11C 16/3445 365/185.11 |
| 2015/0339187 | A1* | 11/2015 | Sharon ................. G11C 29/52 714/766 |

* cited by examiner

Primary Examiner — David Lam
(74) Attorney, Agent, or Firm — Dickinson Wright PLLC

(57) ABSTRACT

A storage system is provided comprising a controller and a memory. The controller is configured to identify at least two physical blocks of memory that are designated as bad blocks because of at least one defective wordline; identify which wordlines in the at least two physical blocks of memory are defective; and create a logical block of memory from non-defective wordlines in the at least two physical blocks of memory, wherein some portions of the logical block are mapped to one of the at least two physical blocks of memory, and wherein other portions of the logical block are mapped to another one of the at least two physical blocks of memory.

20 Claims, 6 Drawing Sheets

STORAGE SYSTEM AND METHOD FOR BAD BLOCK RECYCLING

BACKGROUND

During production and life of a memory device, part of the memory blocks might be found unsuitable for common use and marked as "bad blocks." The cause for marking bad blocks may be due to several reasons, including a broken wordline, a wordline-to-wordline short, memory cell fatigue due to exposure to extreme temperatures, or memory cell wearing due to many program erase cycles. This issue is first met during production where some memory dies are marked unusable due to a large amount of bad blocks. In some production lines, there can be a severe issue of yield loss due to the bad-block criteria.

DETAILED DESCRIPTION

Overview

Figure 1A:
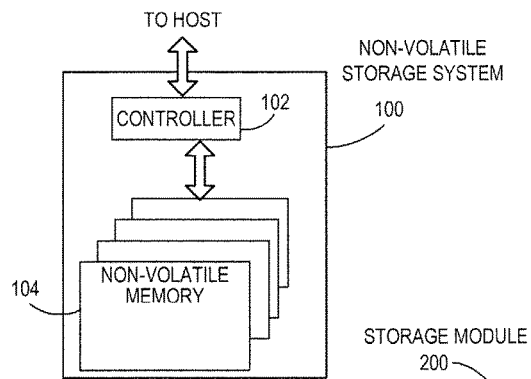
FIG. 1A is a block diagram of a non-volatile storage system of an embodiment.

By way of introduction, the below embodiments relate to a storage system and method for bad block recycling. In one embodiment, a storage system is provided comprising a memory comprising a plurality of physical blocks of memory and a controller. The controller is configured to identify at least two physical blocks of memory that are designated as bad blocks because of at least one defective wordline; identify which wordlines in the at least two physical blocks of memory are defective; and create a logical block of memory from non-defective wordlines in the at least two physical blocks of memory, wherein some portions of the logical block are mapped to one of the at least two physical blocks of memory, and wherein other portions of the logical block are mapped to another one of the at least two physical blocks of memory.

In some embodiments, the controller is configured to identify the at least two physical blocks of memory by determining that a number of non-defective wordlines in the at least two physical blocks of memory sum up to at least a number of wordlines needed to create a logical block.

In some embodiments, the memory comprises a plurality of memory dies organized in a plurality of planes, and wherein the at least two physical blocks of memory are from a same plane.

In some embodiments, the controller is further configured to, for each of the at least two physical blocks of memory, create the logical block by selecting wordlines up to a defective wordline area.

In some embodiments, the controller is further configured to erase wordlines after the defective wordline area in the at least two physical blocks of memory.

In some embodiments, the controller is further configured to create the logical block by selecting wordlines up to the defective wordline area in one of the at least two physical blocks of memory and by selecting wordlines after the defective wordline area in another one of the at least two physical blocks of memory.

In some embodiments, the controller is further configured to write random data up until the defective wordline area in the another one of the at least two physical blocks of memory.

In some embodiments, the memory comprises a three-dimensional memory.

In some embodiments, the storage system is embedded in a host.

In some embodiments, the storage system is removably connected to a host.

In another embodiment, a method for bad block recycling is provided comprising: determining a bit error rate for each of a plurality of bad blocks of memory in a storage system; and writing data redundantly in N number of bad blocks having a same bit error rate, wherein N is based on the bit error rate and increases as the bit error rate increases.

In some embodiments, the memory comprises a three-dimensional memory.

In some embodiments, the storage system is embedded in a host.

In some embodiments, the storage system is removably connected to a host.

In another embodiment, a storage system is provided comprising a plurality of blocks, some of which are designated as bad blocks; and means for creating a logical block of memory from non-defective wordlines in first and second bad blocks, wherein one portion of the logical block is mapped to one or more wordlines in the first bad block and another portion of the logical block is mapped to one or more wordlines in the second bad block.

In some embodiments, the storage system further comprises means for identifying the first and second bad blocks by determining that a number of non-defective wordlines in the first and second bad blocks sum up to at least a number of wordlines needed to create the logical block.

In some embodiments, the storage system further comprises means for writing data redundantly in N number of bad blocks having a same bit error rate, wherein N is based on the bit error rate and increases as the bit error rate increases.

In some embodiments, the memory comprises a three-dimensional memory.

In some embodiments, the storage system is embedded in a host.

In some embodiments, the storage system is removably connected to a host.

Other embodiments are possible, and each of the embodiments can be used alone or together in combination. Accordingly, various embodiments will now be described with reference to the attached drawings.

Embodiments

Figure 1B:
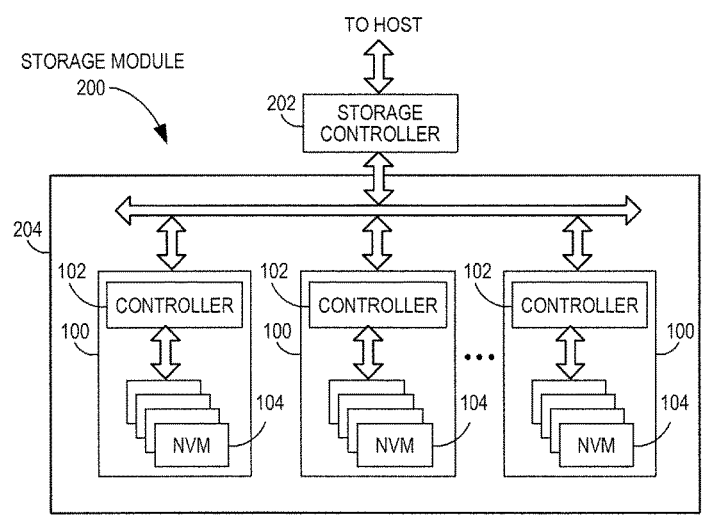
FIG. 1B is a block diagram illustrating a storage module of an embodiment.
Figure 1C:
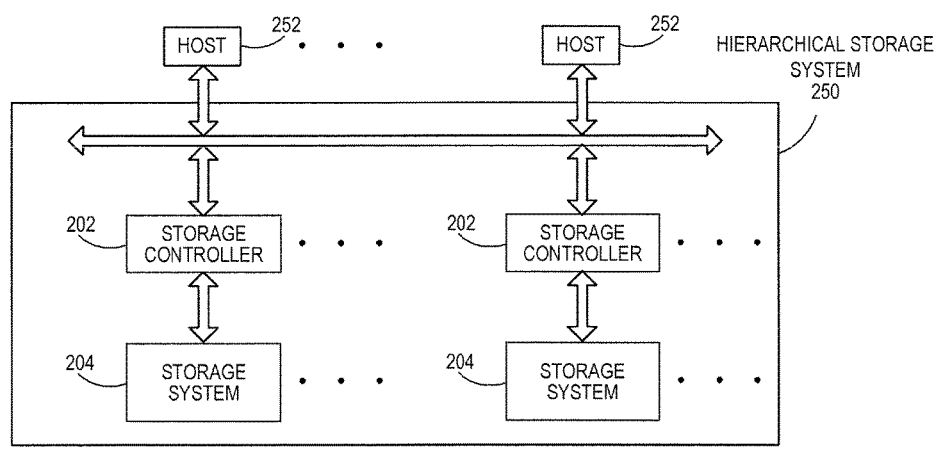
FIG. 1C is a block diagram illustrating a hierarchical storage system of an embodiment.

Storage systems suitable for use in implementing aspects of these embodiments are shown in FIGS. 1A-1C. FIG. 1A is a block diagram illustrating a non-volatile storage system 100 according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it can communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some NAND storage system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be an NVMe or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
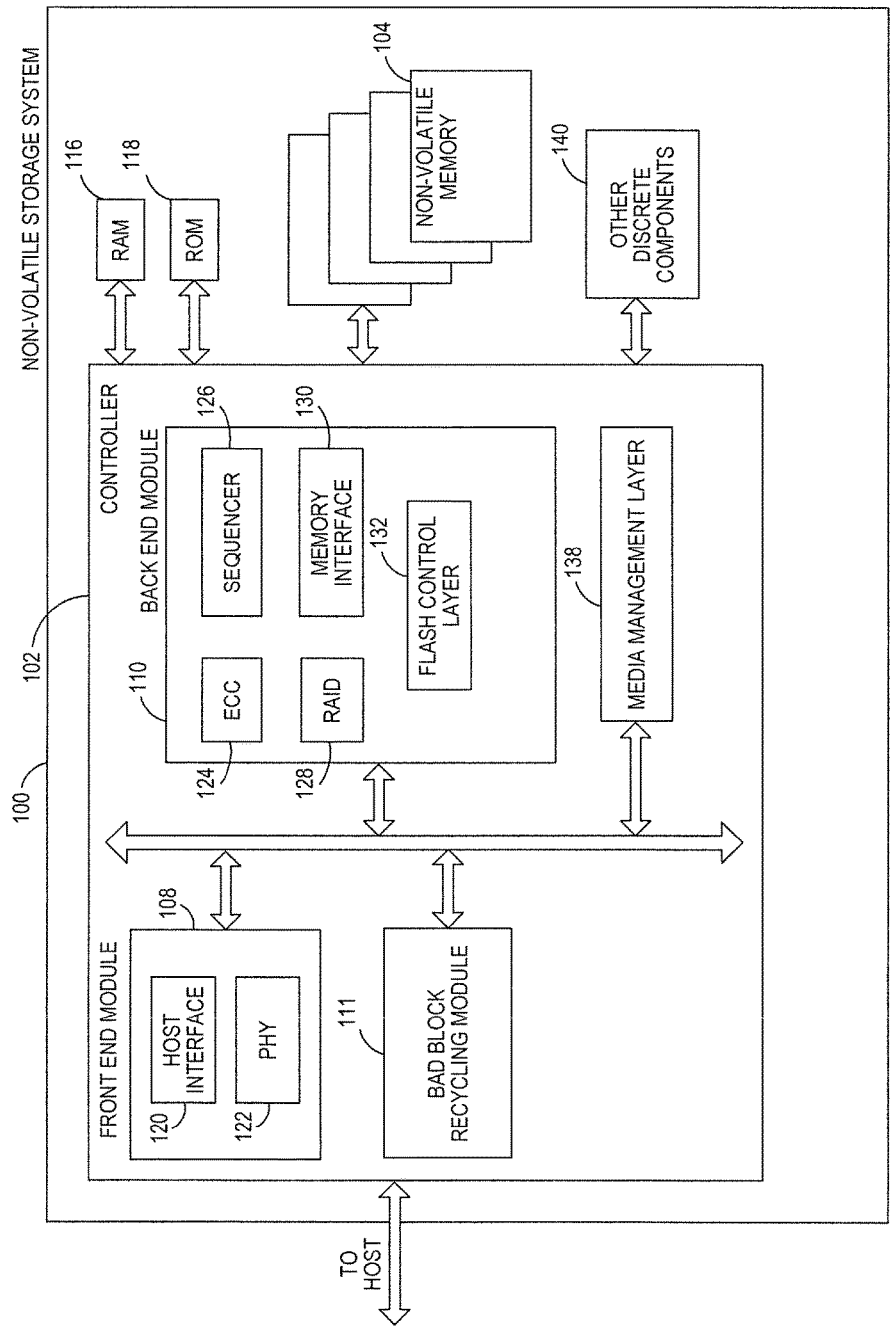
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. Modules of the controller 102 may include a bad block recycling module 111, which is discussed in more detail below, and can be implemented in hardware or software/firmware.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
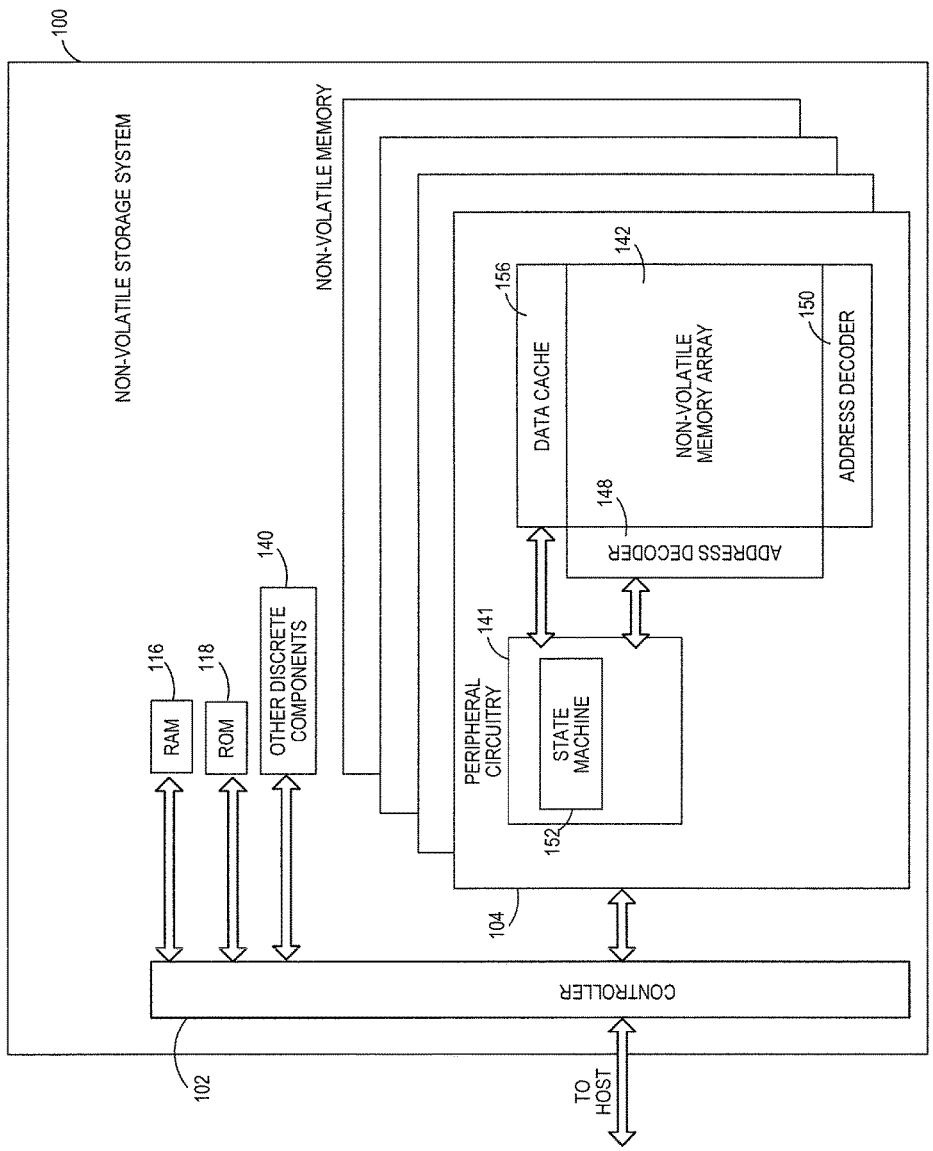
FIG. 2B is a block diagram illustrating components of the non-volatile memory storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

As noted above, during production and life of a memory device, part of the memory blocks might be found unsuitable for common use and marked as "bad blocks." The cause for marking bad blocks may be due to several reasons, including a broken wordline, a wordline-to-wordline short, memory cell fatigue due to exposure to extreme temperatures, or memory cell wearing due to many program erase cycles. This issue is first met during production where some memory dies are marked unusable due to a large amount of bad blocks. In some production lines, there can be a severe issue of yield loss due to the bad-block criteria.

The following embodiments offer ways to utilize some of these bad blocks in a manner that can allow maintaining device throughput, thus relaxing the bad-block criteria and redeeming dies that would otherwise be discarded, and in turn effectively raising product line yield. Moreover, as the number of bad blocks in the storage system grows during the life of a product until the point where the device is unusable, using these embodiments to reuse bad blocks that are created during the life of the product can create new blocks, thus prolonging device life.

In general, these embodiments offer a way to utilize data blocks that would otherwise been unused or used in read-only mode. In one embodiment, some of the blocks that are unused are rendered usable by joining them with other bad blocks (e.g., by partial use of a good wordline or by using a lower code rate). Identifying these blocks can be done starting from day 0 in production and/or maintained during product life by the firmware.

The following paragraphs provide two examples of how to utilize bad blocks, the first tailored-made for blocks with local defects in specific wordlines in the block offering two schemes of mapping, and the second utilizing bad blocks of any kind without diagnosing the blocks illness. Both approaches can be used to increase yield and improve device performance. Of course, these are just examples, and other embodiments can be used.

In both approaches at, day 0 still at the fab, the goal would be to find out if a bad block can be used in order to get a higher yield in the fastest way possible ("go or no go"). Using either of the approaches, the storage system 100 (e.g., the controller 102, the bad block recycling module 111, or another component of the storage system 100) can decide how many joint blocks can be built, thereby increasing the count of good blocks and increasing yield and rising block count in all dies.

1. Blocks with Local Defects

Figure 3:
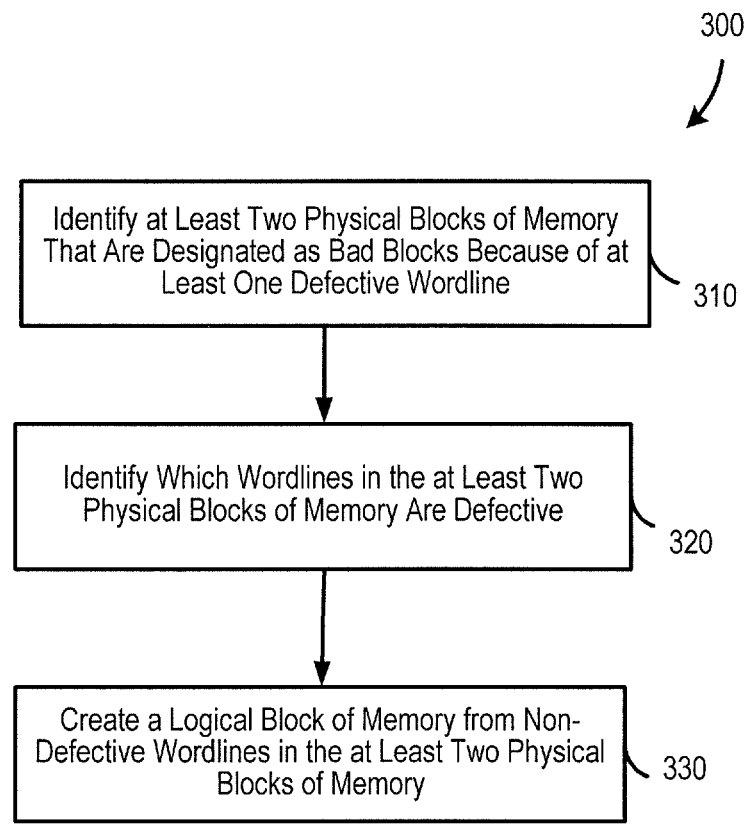
FIG. 3 is a flow chart of a method of an embodiment for bad block recycling.

When a block is disqualified due to local defects (e.g., a wordline-to-wordline short or a broken wordline), most of the block is still functional and contains a large number of useable wordlines. Taking a few blocks and joining them together using the good wordlines of each block can create a valid new logical block. FIG. 3 is a flow chart 300 of a method of embodiment that illustrates this form of bad block recycling. This method can be performed by the controller 102, the bad block recycling module 111, or another component of the storage system 100. As shown in FIG. 3, this method first identifies at least two physical blocks of memory 104 that are designated as bad blocks because of at least one defective wordline (act 310). Then, the method identifies which wordlines in the at least two physical blocks of memory 104 are defective (act 320). Then, the method creates a logical block of memory 104 from non-defective wordlines in the at least two physical blocks of memory 104, wherein some portions of the logical block are mapped to one of the at least two physical blocks of memory 104, and wherein other portions of the logical block are mapped to another one of the at least two physical blocks of memory 104 (act 330).

However, to maintain device performance, a joining technique can be used to maintain the performance of the device while using these joined blocks. For example, one concept in current flash management architectures is working with meta-blocks, allowing the ability to create a pipe line of operations on various planes over several dies, thus increasing the throughput substantially. Therefore, if this meta structure can be maintained, throughput can be maintained. One embodiment keeps this structure by pairing blocks of the same plane. Each plane can be examined separately, and logical joint blocks can be created from the defected blocks, using the logical block as the index in the meta-block and writing to relevant wordlines in defected blocks using an internal mapping. By only pairing blocks from the same plane, the meta-block constraints can be maintained, and performance degradation can be avoided.

Blocks may suffer from defects during the product life due to stress on weak wordlines. These blocks can also be gathered and utilized using these scheme through the life of the device, putting failing blocks back into service.

Joining blocks can be done by pairing couples of blocks taking into account the amount of good wordlines in each block and mapping a new block that is built from these parts, where some of the data is placed in the good wordlines of the first block and some in the good wordlines of the second block. This process can be optimized, such that the joint block has a small as possible number of redundant wordlines, to enable optimal matching of blocks. Two approaches for such mapping are described below.

Strictly-Top Mapping Approach

In this mapping scheme, the defected blocks can be written only up to the defect. Each block can be evaluated by the number of wordlines it has up to the defect (optionally, taking a safety buffer of a few wordlines), and then matched in pairs that sum up to at least the number of wordlines in the given architecture (e.g., 48 in BiCS2), to create a new logical block. This logical block can be recorded in a table indicating where each of its wordlines resides. In practice, it may only be required to keep the number of the blocks building it and the point where we need to jump from one block to the other.

As noted above, each block can be evaluated by the number of wordlines it has up to the defect or up to a wordline that precedes the defect, such as when a safety buffer of a few wordlines is used. For simplicity, the phrase "defective wordline area" will be used herein to refer to either the defective wordline itself or to a wordline that precedes the defective wordline, such as when a safety zone/buffer of N wordlines precedes the defective wordline.

The remainder of the physical block from defective wordline area (e.g., the safety zone) to the end of the block can be kept at erased state, which is beneficial both from a memory perspective, not stressing the defected wordlines (thus avoiding interference) and from a performance perspective, saving the operations of closing a block done in similar cases (e.g., padding with random data).

Figure 4:
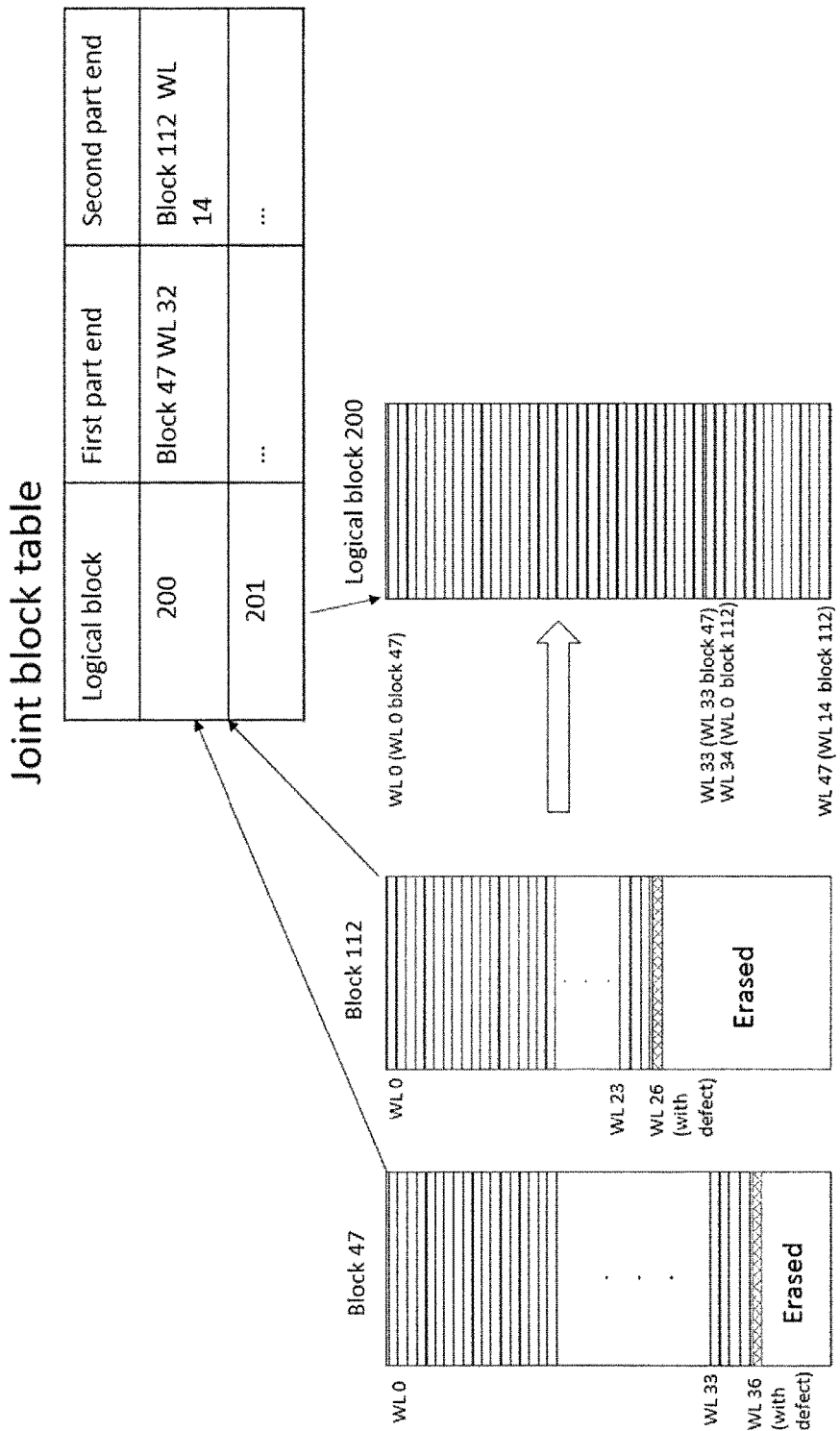
FIG. 4 is an illustration of a joint block table of an embodiment.

FIG. 4 demonstrates a joint block structure under this mapping scheme. In the example, blocks 47 and 112 are joined into a logical block 200, mapping logical WL 0-32 to WL 0-32 in block 47 and logical WL 34-47 to WL 0-14 in block 112. In order to maintain meta-block structure and benefit from it, one embodiment writes to different wordlines in each part of the meta-block, as when we jump to the second defected block, we logically remain at the same wordline as other blocks in the meta-block, but, physically, we start at address 0 of the second block.

In future device (e.g., BiCS3 X3 512 GB, BiCS4 X3), the architecture may enable writing to the different wordline across the meta-block, making this mapping scheme a good candidate, but as current memory devices do not support it, the following mapping scheme can be used.

Top-and-Bottom Mapping Approach

In this mapping scheme, the defected blocks can be divided to two groups, one can be written only up to the defect (as in the previous approach), and the other can be used from the defect onwards, writing random data from the beginning up until a few wordlines after the defect.

In the first group, each block can be evaluated by the number of wordlines it has up to the defect, and, in the second group, by the number of blocks below the defect (optionally, taking a safety buffer of a few wordlines in both groups). Blocks from the first group can be matched with blocks from the second group in a manner that creates logical blocks that sum up to at least the number of wordlines in the given architecture (e.g., 48 in BICS2 X3).

This logical block can be recorded in a table indicating where each of its wordlines resides. In one embodiment, it is only required to keep the numbers of the blocks building it and the point where we need to jump from one block to the other. Work on the logical block can start on the first block at wordline 0, writing up until the defective wordline N and continuing at the second block from wordline N+1 until the end of the block.

When the logical block is the second logical block (i.e., the one written from the defect and below), the block can be written with random data up to and including wordline N. If this is a background operation, the throughput rates may not be damaged. Moreover, SLC programming can be used up until the two wordlines before the data to speed up the processes even more.

This approach preserves wordline addressing and allows the storage system 100 to write to the logical block within a meta-block using the same wordline number as other blocks, thus maintaining the performance of a regular meta-block.

Figure 5:
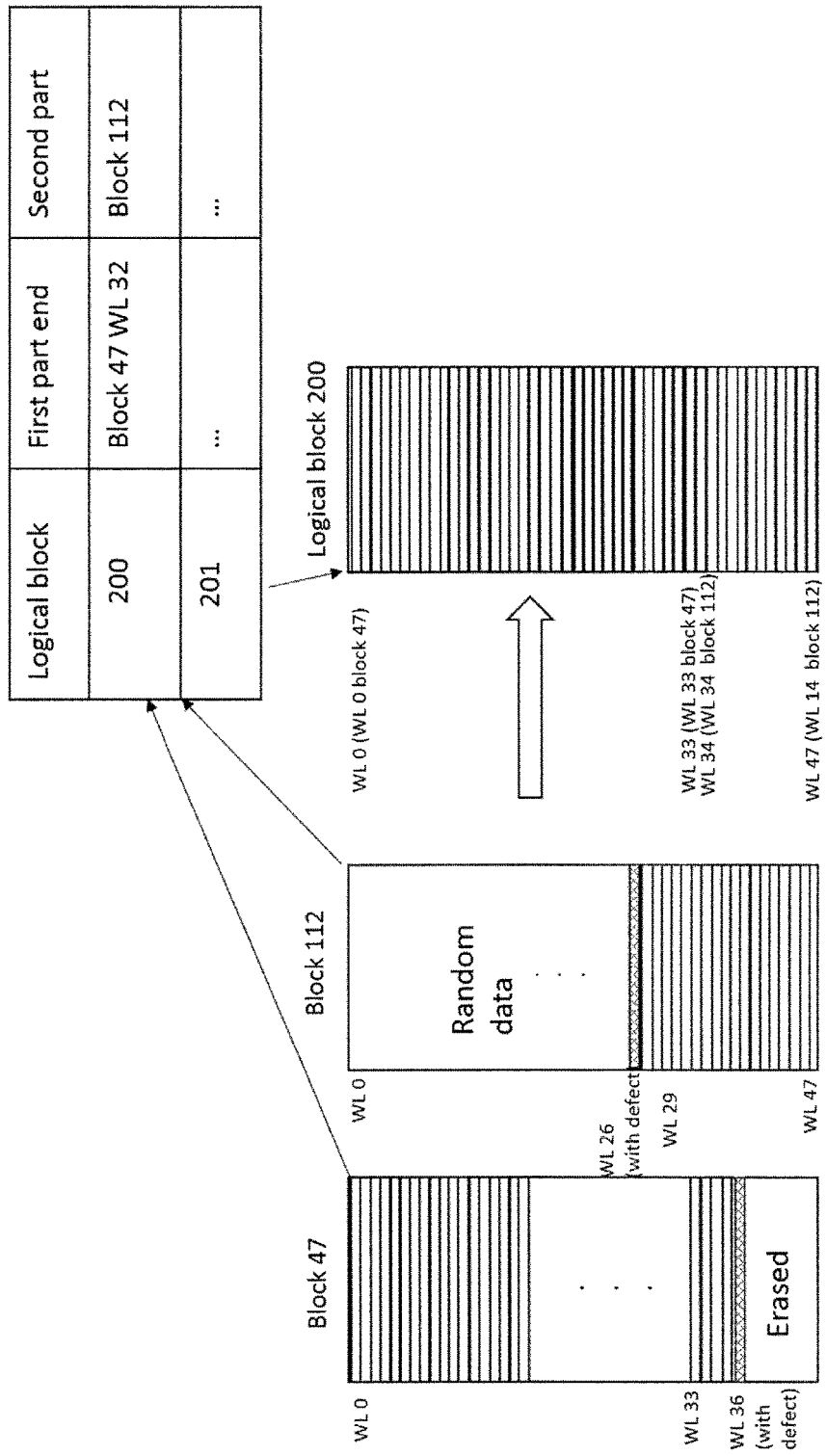
FIG. 5 is an illustration of a joint block table of another embodiment.

FIG. 5 demonstrates a joint block structure under this mapping scheme. In the example, blocks 47 and 112 are joint into a logical block 200, mapping logical WL 0-32 to WL 0-32 in block 47 and logical WL 33-47 to WL 33-47 in block 112.

In both mapping schemes, in order to improve firmware simplicity, the storage system 100 can try to match logical blocks with similar broken wordlines by finding a common border word to jump from and assigning it to the group, thus simplifying the mapping table.

2. Blocks with Unknown Defects

Instead of looking at the bad blocks as one homogenous group, we canary to separate them to terminal and curable blocks. Blocks that are marked as terminal can be retired, and blocks marked as curable can be fitted to a lower rate and sent back to the good blocks pool.

Diagnoses of blocks can be done using a short validation test. In this process, the block can be tested with a series of write read actions, if the blocks passes and the written pattern is read successfully with a low enough bit error rate (BER), it can be sent back to work using the tested code rate, if the block fails it can be retested using lower rates. If, after the diagnoses process, the block has failed, it can be marked as terminal and decommissioned or used as read only.

One simple way to lower the code rate is writing the data several times to several different bad blocks and using them jointly to create soft-bit-like indications with very high certainty. For example, a rate of ~0.5 can be achieved by using two bad blocks to create a joint block. A code with a 0.5 code rate is a very powerful code—much stronger than a regular code with a code rate of ~0.9, thus being able to handle much more errors. In other words, in one embodiment, the storage system 100 (e.g., the controller 102, the bad block recycling module 111, or another component of the storage system 100) determines a bit error rate for each of a plurality of bad blocks of memory in a storage system and writes data redundantly in N number of bad blocks having a same bit error rate, wherein N is based on the bit error rate and increases as the bit error rate increases. For simplicity, the "same bit error rate" can refer to a specific bit error rate or a range of bit error rates.

The following is a more-detailed description of the decoding process of an embodiment, where the decoding rate is 0.5. As discussed above, lowering the code rate can be simply archived by pairing two blocks together and writing the same data to both blocks. When approaching the decoding phase, both pages can be read and handed to a decoder, which can chose how to relate them. A simple way, which can require little or no change to hardware and the firmware data path, is for the decoder to use one copy as the source data and XNOR both copies as a soft-bit indication. Such a method can work very well on blocks with high BERs due to cell fatigue and wear, which usually have random noise on both pages but can fail on broken wordlines or a wordline-to-wordline short, which can have very high errors concentrated in certain locations.

Another approach would be to estimate BER on both pages and adjust the log-likelihood ratio (LLR) information used in low-density parity-check (LDPC) codes before decoding. If both pages have similar BERs, the LLR table can give similar weight to both pages, thus yielding the previous method. But if one of the pages is damaged, it can yield a high BER, thus giving a low significance by low weight in the LLR table, enabling its mate block to be dominant. Therefore, if using this approach, the best match for a broken wordline block may be another block with a broken wordline at a different location, which can be utilized in this method in a complimentary manner. This method may require more changes in firmware or some minor changes in hardware but can give better results.

Some block pairing choices may still create un-decodable data (e.g., the rare case of two blocks with same broken wordline), but as all blocks have to pass a diagnoses test prior to use in one embodiment, such a match may not be valid, and those blocks can either be fitted with other mates or retired.

With such a powerful code, these types of blocks may have better performance than typical blocks used by the device where the only penalty is the enlarged number of read/write/erase operations per joint block. This penalty can be addressed by various parallel-access approaches or, alternatively, accepted, in which case the application can use these slower blocks to store data that is less sensitive to performance (e.g., internal logs, cold data, etc.).

In this case, block diagnoses can be done on pairs of blocks, taking a block from the bad block pool, pairing it with another block from the pool, and writing a test vector to both. The data can then be decoded using the method described above and, if decoded successfully with a low enough error rate, the pair can be declared as a joint block and returned to service.

Each block that fails the diagnoses test can increment a failure counter and, after reaching a predetermined number of tries, can be marked as terminal and decommissioned.

There are several advantages associated with these embodiments. For example, the embodiments can be used to salvage bad blocks that otherwise would be useless creating additional capacity on the device both on day 0 and during product life. This additional capacity can help in a number of ways. For example, joint blocks may be taken into account, thus relaxing the threshold of good blocks required per plane and increasing the production line yield. As another example, these embodiments can increase overprovisioning, thus improving write amplifications, which in turn improve performance and reduces the wearing of the NAND. Further, these embodiments can prolong device life span, as it can have more blocks to work with and lower the rate in which blocks become unusable, thus buying more time before the device reaches the point where no blocks are available.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A storage system comprising:
    a memory comprising a plurality of physical blocks of memory; and
    a controller in communication with the memory, wherein the controller is configured to:
        identify at least two physical blocks of memory that are designated as bad blocks because of at least one defective wordline;
        identify which wordlines in the at least two physical blocks of memory are defective; and
        create a logical block of memory from non-defective wordlines in the at least two physical blocks of memory, wherein some portions of the logical block are mapped to one of the at least two physical blocks of memory, and wherein other portions of the logical block are mapped to another one of the at least two physical blocks of memory.

2. The storage system of claim 1, wherein the memory comprises a plurality of memory dies organized in a plurality of planes, and wherein the at least two physical blocks of memory are from a same plane.

3. The storage system of claim 1, wherein the controller is further configured to, for each of the at least two physical blocks of memory, create the logical block by selecting wordlines up to a defective wordline area.

4. The storage system of claim 3, wherein the controller is further configured to erase wordlines subsequent to the defective wordline area in the at least two physical blocks of memory.

5. The storage system of claim 1, wherein the controller is further configured to create the logical block by selecting wordlines preceding the defective wordline area in one of the at least two physical blocks of memory and by selecting wordlines subsequent to the defective wordline area in another one of the at least two physical blocks of memory.

6. The storage system of claim 5, wherein the controller is further configured to write random data preceding the defective wordline area in the another one of the at least two physical blocks of memory.

7. The storage system of claim 1, wherein the memory comprises a three-dimensional memory.

8. The storage system of claim 1, wherein the storage system is embedded in a host.

9. The storage system of claim 1, wherein the storage system is removably connected to a host.

10. A storage system comprising:
    a memory comprising a plurality of physical blocks of memory; and
    a controller in communication with the memory, wherein the controller is configured to:
        identify at least two physical blocks of memory that are designated as bad blocks because of at least one defective wordline;
        identify which wordlines in the at least two physical blocks of memory are defective; and
        create a logical block of memory from non-defective wordlines in the at least two physical blocks of memory, wherein some portions of the logical block are mapped to one of the at least two physical blocks of memory, and wherein other portions of the logical block are mapped to another one of the at least two physical blocks of memory;

wherein the controller is configured to identify the at least two physical blocks of memory by determining that a number of non-defective wordlines in the at least two physical blocks of memory sum up to at least a number of wordlines needed to create a logical block.

11. A method for bad block recycling, the method comprising:

determining a bit error rate for each of a plurality of bad blocks of memory in a storage system; and writing data N number of times, once in each of N number of bad blocks having a same bit error rate, wherein N>1 and is based on the bit error rate and increases as the bit error rate increases.

12. The method of claim 11, wherein the memory comprises a three-dimensional memory.

13. The method of claim 11, wherein the storage system is embedded in a host.

14. The method of claim 11, wherein the storage system is removably connected to a host.

15. A storage system comprising:

a memory comprising a plurality of physical blocks of memory;

means for identifying at least two physical blocks of memory that are designated as bad blocks because of at least one defective wordline;

means for identifying which wordlines in the at least two physical blocks of memory are defective; and means for creating a logical block of memory from non-defective wordlines in the at least two physical blocks of memory, wherein some portions of the logical block are mapped to one of the at least two physical blocks of memory, and wherein other portions of the logical block are mapped to another one of the at least two physical blocks of memory.

16. The storage system of claim 15 further comprising means for identifying the at least two physical blocks of memory by determining that a number of non-defective wordlines in the at least two physical blocks of memory sum up to at least a number of wordlines needed to create the logical block.

17. The storage system of claim 15 further comprising means for writing data redundantly in N number of bad blocks having a same bit error rate, wherein N is based on the bit error rate and increases as the bit error rate increases.

18. The storage system of claim 15, wherein the memory comprises a three-dimensional memory.

19. The storage system of claim 15, wherein the storage system is embedded in a host.

20. The storage system of claim 15, wherein the storage system is removably connected to a host.

* * * * *